US 8,972,838 B2

(12) United States Patent
Tu et al.

(10) Patent No.: US 8,972,838 B2
(45) Date of Patent: Mar. 3, 2015

(54) DATA TRANSMISSION DETECTING DEVICE, DATA TRANSMISSION DETECTING METHOD AND ELECTRONIC DEVICE THEREOF

(75) Inventors: Wei-Ying Tu, Hsinchu (TW); Hsi-Chi Ho, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 273 days.

(21) Appl. No.: 13/089,293

(22) Filed: Apr. 18, 2011

(65) Prior Publication Data

US 2012/0030549 A1 Feb. 2, 2012

(30) Foreign Application Priority Data

Jul. 27, 2010 (TW) ................................ 99124784 A

(51) Int. Cl.
| | |
|---|---|
| *G06F 13/00* | (2006.01) |
| *G06F 11/10* | (2006.01) |
| *H03M 13/09* | (2006.01) |
| *H04L 1/00* | (2006.01) |
| *H04L 1/08* | (2006.01) |

(52) U.S. Cl.
CPC ......... *G06F 11/1004* (2013.01); *H03M 13/091* (2013.01); *H04L 1/0045* (2013.01); *H04L 1/0061* (2013.01); *H04L 1/08* (2013.01)
USPC ....................................................... 714/821

(58) Field of Classification Search
USPC .......................................... 714/821, E11.032
See application file for complete search history.

(56) References Cited

U.S. PATENT DOCUMENTS

| | | | | |
|---|---|---|---|---|
| 7,590,916 | B2 * | 9/2009 | Katashita et al. ............. | 714/757 |
| 2004/0025105 | A1 * | 2/2004 | Doubler et al. ............... | 714/781 |
| 2004/0098655 | A1 * | 5/2004 | Sharma ......................... | 714/758 |

(Continued)

FOREIGN PATENT DOCUMENTS

CN 1409492 4/2003

OTHER PUBLICATIONS

Author: Junho Cho, Baeksang Sung, and Wonyong Sung (Department of Electrical Engineering Seoul National University); Title: Block-Interleaving Based Parallel CRC Computation for Multi-Processor Systems; Publisher: IEEE 978-1-4244-8933-6/10; Date: 2010.*

(Continued)

*Primary Examiner* — April Y Blair
*Assistant Examiner* — Thien D Nguyen
(74) *Attorney, Agent, or Firm* — Jianq Chyun IP Office

(57) ABSTRACT

A data transmission detecting device including a detecting module and a detection value calculating module is provided. The detecting module has a plurality of receiving terminals and receives a first data and a second data during a first period. The detecting module calculates a total detection value according to the first data and the second data, and performs an error check comparison by comparing the total detection value with an error check code. When the detecting module again receives the first data during a second period, the detection value calculating module transmits an auxiliary detection value to the detecting module, so that the detecting module calculates a corresponding total detection value according to the auxiliary detection value, and performs the error check comparison by comparing the total detection value with the error check code. The first period and the second period are two successive periods adjacent to each other.

20 Claims, 3 Drawing Sheets

(56) References Cited

U.S. PATENT DOCUMENTS

| | | | |
|---|---|---|---|
| 2004/0247121 A1* | 12/2004 | Lee et al. | 380/205 |
| 2008/0195915 A1* | 8/2008 | Leonard et al. | 714/757 |
| 2009/0080579 A1* | 3/2009 | Fujii | 375/347 |
| 2009/0164865 A1* | 6/2009 | Leonard et al. | 714/755 |

OTHER PUBLICATIONS

"First Office Action of China Counterpart Application", issued on Sep. 29, 2013, p1-p5.

* cited by examiner

DATA TRANSMISSION DETECTING DEVICE, DATA TRANSMISSION DETECTING METHOD AND ELECTRONIC DEVICE THEREOF

CROSS-REFERENCE TO RELATED APPLICATION

This application claims the priority benefit of Taiwan application serial no. 99124784, filed Jul. 27, 2010. The entirety of the above-mentioned patent application is hereby incorporated by reference herein and made a part of this specification.

BACKGROUND

1. Field of the Invention

The invention relates to a data transmission detecting device and a data transmission detecting method thereof. Particularly, the invention relates to a data transmission detecting device capable of improving data transmission correctness, and a data transmission detecting method thereof.

2. Description of Related Art

Since the dynamic random access memory (DRAM) has advantages of low cost and high capacity, electronic products generally use the DRAM as a memory solution, and the DRAM is an indispensable part of the electronic product. In view of applications, the DRAM is mainly applied to information technology (IT) products such as desktop computers, notebook computers, DRAM upgrade modules, servers and workstations, etc.

In a communication system or a computer system, a cyclic redundancy check (CRC) can be used to improve an error check capability for the DRAM. After the data transmission or data storage, the CRC can be used check whether an error is occurred during the data transmission. During the data transmission, both of sending and receiving ends are required to perform a CRC calculation, and then a certain end compares CRC results calculated by the sending and the receiving ends, so as to determine whether the received data has an error.

If the CRC is used to improve a data reading correctness of the memory, the CRC calculation is performed only when the data is confirmed to be ready. If the CRC calculation is performed before the data is ready, an error CRC calculation result is obtained.

Moreover, in the DRAM, some data buses are probably shared. When data is successively read, if a CRC calculation time is not under control, data conflict is liable to be occurred. Especially, when the CRC calculation time is relatively long, if a next batch of data is received before the CRC calculation is completed, an error is occurred.

SUMMARY OF THE INVENTION

The invention is directed to a data transmission detecting device, which can improve data transmission correctness.

The invention is directed to a data transmission detecting method, by which data transmission correctness can be improved.

The invention is directed to an electronic device, which includes the aforementioned data transmission detecting device.

The invention provides a data transmission detecting device including a detecting module and a detection value calculating module. The detecting module has a plurality of receiving terminals and receives a first data and a second data during a first period. The detecting module calculates a total detection value according to the first data and the second data, and performs an error check comparison by comparing the total detection value with an error check code. The detection value calculating module is coupled to the detecting module. When the detecting module again receives the first data during a second period, the detection value calculating module transmits an auxiliary detection value to the detecting module, so that the detecting module calculates a corresponding total detection value according to the auxiliary detection value, and performs the error check comparison by comparing the total detection value with the error check code. The first period and the second period are two successive periods adjacent to each other.

In an embodiment of the invention, the detection value calculating module calculates the auxiliary detection value during the first period according to the first data received during the second period.

In an embodiment of the invention, when the detecting module again receives the second data during a third period, the detecting module calculates the corresponding total detection value according to the second data of the third period and the auxiliary detection value.

In an embodiment of the invention, when the detecting module again receives the first data during the second period, and successively receives the error check code, the detecting module takes the auxiliary detection value as the corresponding total detection value.

In an embodiment of the invention, the data transmission detecting device further includes an initial module. The initial module is coupled to the detecting module, and outputs an initial data to initialize the detecting module, so that the detecting module performs the error check comparison.

In an embodiment of the invention, the detecting module calculates the total detection value according to the initial data and the first data of the first period.

In an embodiment of the invention, the detection value calculating module includes a calculating unit, a detecting unit and a switch. The calculating unit receives the first data corresponding to the second period, and calculates the auxiliary detection value according to the first data of the second period. The detecting unit detects a data receiving state of the detecting module, and accordingly outputs a detection result. The switch is coupled to the detecting unit. The switch receives the auxiliary detection value and the initial data, and determines to output the initial data or the auxiliary detection value according to the detection result.

In an embodiment of the invention, the detecting module includes a plurality of detecting units. The detecting units respectively correspond to the receiving terminals. The detecting units are connected in series, and a part of the detecting units calculates a second detection value according to a first detection value of the detecting unit of a previous stage and a received data.

In an embodiment of the invention, the detecting module further includes a switch unit. The switch unit is coupled to the detecting units, and receives one of the second detection values from the detecting units to serve as the total detection value.

In an embodiment of the invention, the error check comparison is a cyclic redundancy check (CRC).

The invention provides a data transmission detecting method, which includes following steps. First, a first data and a second data are received during a first period, and a total detection value is calculated according to the first data and the second data. Then, an error check comparison is performed by comparing the total detection value with an error check code. Then, when the first data is again received during a second period, an auxiliary detection value is transmitted to calculate a corresponding total detection value. Finally, the error check comparison is performed by comparing the total detection value with the error check code, wherein the first period and the second period are two successive periods adjacent to each other.

In an embodiment of the invention, the auxiliary detection value is calculated during the first period according to the first data received during the second period.

In an embodiment of the invention, the data transmission detecting method further includes that when the second data is again received during a third period, the corresponding total detection value is calculated according to the second data of the third period and the auxiliary detection value.

In an embodiment of the invention, the data transmission detecting method further includes that when the first data is again received during the second period, and the error check code is successively received, the auxiliary detection value is taken as the corresponding total detection value.

In an embodiment of the invention, the data transmission detecting method further includes outputting an initial data, so as to perform the error check comparison.

In an embodiment of the invention, the total detection value is calculated according to the initial data and the first data of the first period.

In an embodiment of the invention, the detection value calculating method further includes following steps. A data receiving state of a detecting module is detected so as to output a detection result. The auxiliary detection value and the initial data are received, and the initial data or the auxiliary detection value is output according to the detection result.

In an embodiment of the invention, the detection value calculating method further includes calculating a second detection value according to a first detection value of a previous stage and a received data.

In an embodiment of the invention, the total detection value is the second detection value.

In an embodiment of the invention, the first data and the second data comply with a mobile industry processor interface (MIPI) specification.

Besides, the invention also provides an electronic device, which is equipped with the aforementioned data transmission detecting device.

According to the above descriptions, in the invention, the detection value calculating module is used to calculate the auxiliary detection value, and if necessary, the auxiliary detection value is transmitted to the detecting module to calculate the total detection value, so as to avoid obtaining an error total detection value, and accordingly improve the data transmission correctness.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In a following embodiment, a cyclic redundancy check (CRC) is taken as an example, though those skilled in the art should understand that the CRC is not used to limit an error check of the invention. Any electronic device having an error check function is considered to be within the scope of the invention.

Figure 1:
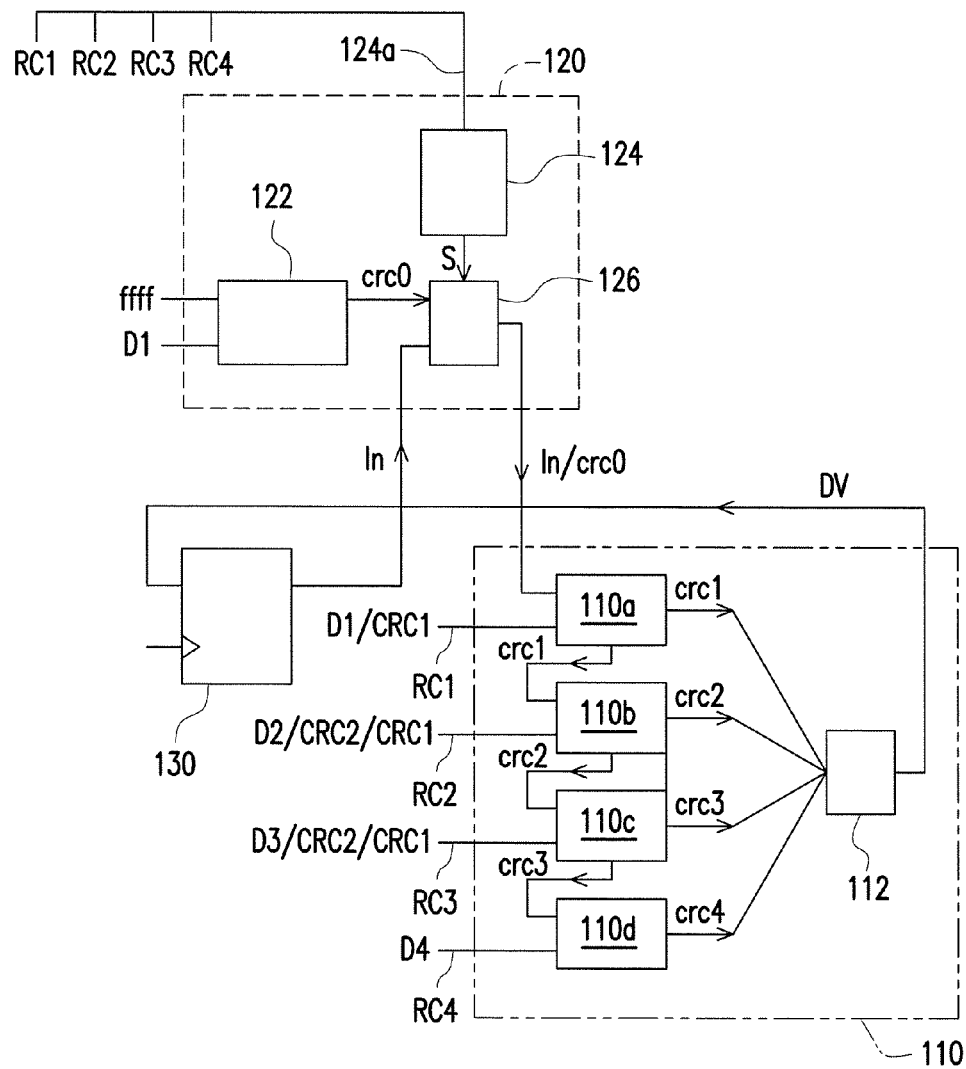
FIG. 1 is a schematic diagram illustrating a data transmission detecting device according to an embodiment of the invention.

FIG. 1 is a schematic diagram illustrating a data transmission detecting device according to an embodiment of the invention. Referring to FIG. 1, the data transmission detecting device 100 includes a detecting module 110 and a detection value calculating module 120, wherein the detection value calculating module 120 is coupled to the detecting module 110. Moreover, the detecting module 110 has a plurality of receiving terminals RC1-RC4 (only four receiving terminals are schematically illustrated in FIG. 1) for receiving data D1 and D2 during a first period. The detecting module 110 calculates a total detection value DV according to the data D1 and D2, and performs an error check comparison by comparing the total detection value DV with an error check code. Wherein, the error check comparison is, for example, the CRC.

Further, the detecting module 110 of the present embodiment includes a plurality of detecting units $110a$, $110b$, $110c$ and $110d$. The detecting units $110a$-$110d$ are connected in series, and respectively correspond to the receiving terminals RC1-RC4, wherein the receiving terminals RC1-RC4 may correspondingly receive data D1-D4. A part of the detecting units $110b$-$110d$ calculate corresponding detection values according to detection values crc1-crc3 of previous stages and received data D2-D4. In detail, the detecting unit $110b$ of a second stage calculates the detection value crc2 according to the data D2 and the detection value crc1 of the detecting unit $110a$ of a first stage, and transmits the detection value crc2 to the detecting unit $110c$ of a third stage. Then, the detecting unit $110c$ of the third stage calculates the detection value crc3 according to the data D3 and the detection value crc2 of the detecting unit $110b$ of the second stage. Deduced by analogy, the detecting unit $110d$ of a fourth stage calculates the detection value crc4 according to the data D4 and the detection value crc3 of the detecting unit $110c$ of the third stage.

In other words, the data transmission detecting device 100 is, for example, a CRC structure of four channels, in which the detecting units $110a$-$110d$ can be used to respectively calculate the detection values crc1-crc4 of the data D1-D4, and the detection values crc2-crc4 relate to the detection values crc1-crc3 calculated in the pervious stages. Moreover, each batch of data is, for example, 8 bits, so that the data transmission detecting device 100 of the present embodiment may simultaneously process 32 bits data at most, though the invention is not limited thereto.

Moreover, the detecting module 110 further includes a switch unit 112, and the switch unit 112 is, for example, a switch. The switch unit 112 is coupled to the detecting units 110a-110d, and receives one of the detection values crc1-crc4 from the detecting units 110a-110d. In detail, when only the detecting unit 110a in the detecting module 110 receives the data D1, the switch unit 112 receives the detection value crc1 to serve as the total detection value DV. When the detecting units 110a and 110b in the detecting module 110 respectively receive the data D1 and D2, the switch unit 112 receives the detection value crc2 to serve as the total detection value DV. Deduced by analogy, when the detecting units 110a-110d in the detecting module 110 respectively receive the data D1-D4, the switch unit 112 receives the detection value crc4 to serve as the total detection value DV.

Moreover, the data transmission detecting device 100 of the present embodiment further includes an initial module 130. The initial module 130 is, for example, a flip-flop. The initial module 130 is coupled to the detecting module 110, and outputs an initial data In to initialize the detecting module 110. The detecting module 110 calculates the total detection value DV according to the initial data In and the data D1, so as to perform the error check comparison.

In detail, in the present embodiment, the detecting module 110 calculates a detection value crc0 according to the initial data In and the data D1, so as to generate the total detection value DV. Moreover, the initial data In can also be used to erase CRC calculation results (for example, the detection values crc1-crc4) of the detecting module 110 of a previous period, so as to avoid a situation that the CRC calculation results of the previous period influence CRC calculation results of a next period, and accordingly avoid obtaining an error total detection value.

Figure 2A:
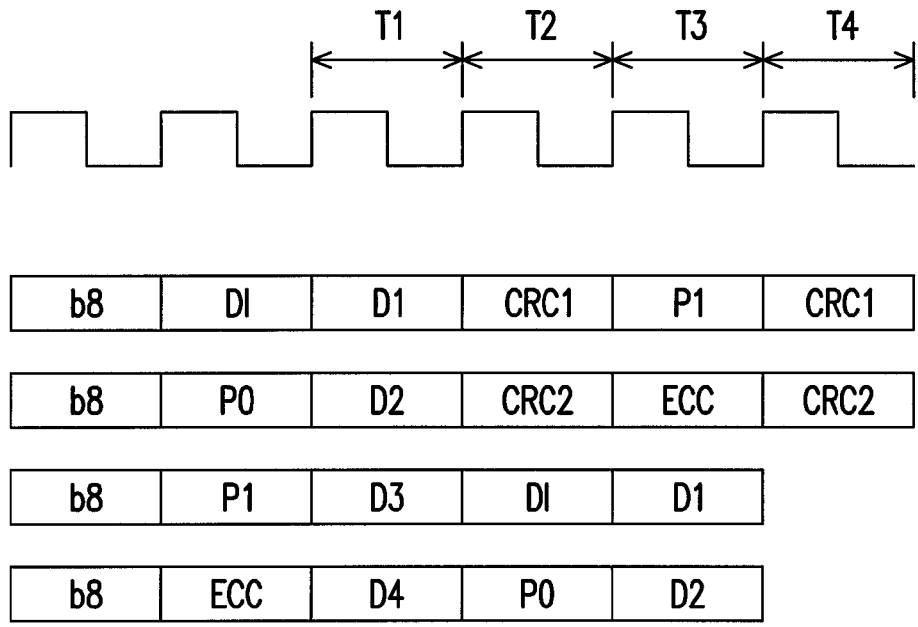
FIG. 2A is a timing diagram that a data transmission detecting device of FIG. 1 receives data.

FIG. 2A is a timing diagram that the data transmission detecting device 100 of FIG. 1 receives data. In the present embodiment, data transmission is performed according to a mobile industry processor interface (MIPI) specification, wherein b8 of FIG. 2A represents that data transmission is started, DI is a data identifier code, P0 and P1 represent total batches of data to be transmitted, ECC represents a header, D1-D4 represent data to be transmitted, and CRC1 and CRC2 represent the error check codes.

Referring to FIG. 1 and FIG. 2A, the detecting units 110a-110d of the detecting module 110 respectively receive the data D1-D4 during a period T1, and the detecting module 110 calculates the total detection value DV of, for example, 16 bits according to the data D1-D4. Then, the error check comparison is performed by comparing the total detection value DV with the error check codes CRC1 and CRC2 received during a period T2, so as to determine whether the data D1-D4 received during the period T1 are correct. Meanwhile, the initial module 130 may also initialize all data in the detecting module 110 during the period T2, and wait for data reception of a next period. As shown in FIG. 2A, the detecting units 110a-110b again receive the data D1 and D2 during a period T3, and the total detection value DV corresponding to the data D1 and D2 is calculated. Then, the detecting mole 110 again performs the error check comparison by comparing the total detection value DV corresponding to the data D1 and D2 with the error check codes CRC1 and CRC2 received during a period T4, so as to determine whether the data D1 and D2 received during the period T3 are correct.

It should be noticed that since between the period T1 and the period T3 for calculating the total detection values DV, there is the period T2, during which the initial module 130 can initialize the detecting module 110, the correct total detection value DV corresponding to the data D1 and D2 of the period T3 can be obtained. Namely, based on the initial operation of the initial module 130, the total detection value DV corresponding to the data D1-D4 of the period T1 does not influence a calculation result of the total detection value DV corresponding to the data D1 and D2 of the period T3.

Figure 2B:
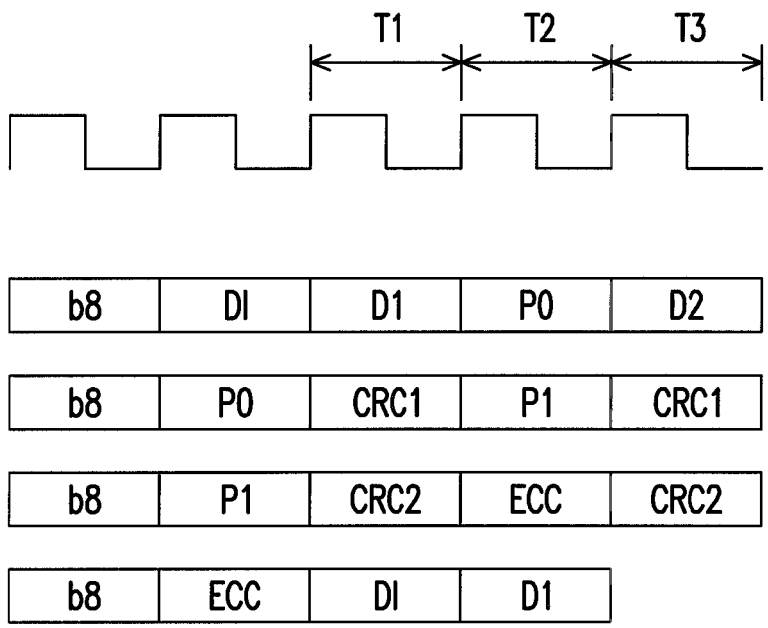
FIG. 2B is another timing diagram that a data transmission detecting device of FIG. 1 receives data.

FIG. 2B is another timing diagram that the data transmission detecting device 100 of FIG. 1 receives data. Referring to FIG. 1 and FIG. 2B, the detecting units 110a of the detecting module 110 receives data D1 during the period T1, and the detecting module 110 calculates the total detection value DV according to the data D1. Then, the error check comparison is performed by comparing the total detection value DV with the received error check codes CRC1 and CRC2, so as to determine whether the data D1 received during the period T1 is correct. Then, the detecting unit 110a of the detecting module 110 again receives the data D1 during the period T2. It should be noticed that since there is no enough time to initialize the detecting module 110 during the period T1 and the period T2, an error total detection value DV is obtained on the condition that the CRC calculation is directly performed to the data D1 of the period T2.

Accordingly, in the present embodiment, the detection value calculating module 120 is used to avoid the above problem. Referring to FIG. 1 and FIG. 2B, in detail, when the detecting module 110 receives another batch of the data D1 during the period T2, the detection value calculating module 120 may transmit an auxiliary detection value crc0 to the detecting module 110, so that the detecting module 110 may calculate the corresponding total detection value DV according to the auxiliary detection value crc0. Wherein, the detection value calculating module 120 calculates the auxiliary detection value crc0 during the period T1 according to the data D1 received during the period T2. In other words, the detection value calculating module 120 performs the CRC calculation to the data D1 of the period T2 in advance during a previous period (i.e. the period T1) of the period T2, so as to obtain the auxiliary detection value crc0.

Then, when the detecting module 110 continually receives the data D2 during the period T3, the detecting module 110 can calculate the total detection value DV according to the data D2 and the auxiliary detection value crc0 without being influenced by a previous CRC calculation result. Herein, the auxiliary detection value crc0 is equivalent to the detection value crc1 of FIG. 1. In other words, when the detection value calculating module 120 detects that there is no enough time to initialize the detecting module 110 during calculations of two batches of the total detection values DV, the detection value calculating module 120 can transmit the pre-calculated detection value (i.e. the auxiliary detection value crc0) to the detecting module 110 to serve as the initial data. Therefore, a situation that there is not time to calculate the total detection value DV can be avoided, so that the correct CRC calculation result can be obtained.

Figure 2C:
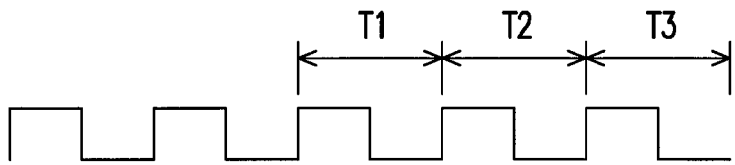
FIG. 2C is another timing diagram that a data transmission detecting device of FIG. 1 receives data.
Figure 2C:
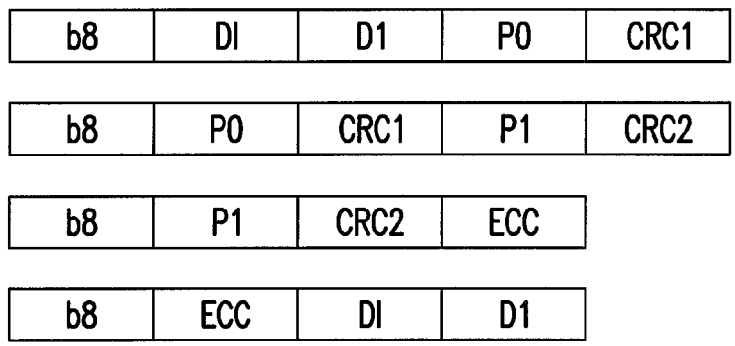

On the other hand, as that shown in FIG. 2C, when the detecting module 110 receives the data D1 during the period T2, and successively receives the error check codes CRC1 and CRC2, it represents that transmission of all data has been completed. Therefore, the detecting module 110 directly takes the auxiliary detection value crc0 as the corresponding total detection value DV, and performs the error check comparison by comparing the total detection value DV with the error check codes CRC1 and CRC2, so as to determine whether the data D1 received during the period T2 is correct.

In other words, in the present embodiment, by using the detection value calculating module 120, even if there is no enough time to initialize the detecting module 110 during calculations of two batches of the total detection values DV, the detecting module 110 can still perform the CRC calculation.

Referring to FIG. 1 again, the detection value calculating module 120 includes a calculating unit 122, a detecting unit 124 and a switch 126. In the present embodiment, the calculating unit 122 receives the data D1 corresponding to the period T2, and calculates the auxiliary detection value crc0 according to the data D1. Moreover, the calculating unit 122 also calculates the auxiliary detection value crc0 according to an initial setting value ffff. Then, the detecting unit 124 detects a data receiving state of the detecting module 110 via a terminal 124a, and outputs a detection result S. The switch 126 is coupled to the detecting unit 124, receives the auxiliary detection value crc0 and the initial data In, and determines to output the initial data In or the auxiliary detection value crc0 according to the detection result S.

In detail, as that shown in FIG. 2A, if the detecting unit 124 detects that there is enough time (for example, the period T2 of FIG. 2A) to initialize the detecting module 110 during calculations of the two batches of the total detection values DV, the switch 126 outputs the initial data In to the detecting module 110 according to the detection result S.

On the other hand, as that shown in FIG. 2B and FIG. 2C, if the detecting unit 124 detects that there is no enough time to initialize the detecting module 110 during calculations of two batches of the total detection values DV, the switch 126 outputs the auxiliary detection value crc0 to the detecting module 110 according to the detection result S, so that the detecting module 110 can calculate the correct total detection value DV. Moreover, in an embodiment, the data transmission detecting device 100 is, for example, used in an electronic device such as a computer system, and the data transmission detecting device 100 is used for detecting whether the data transmission is correct.

Figure 3:
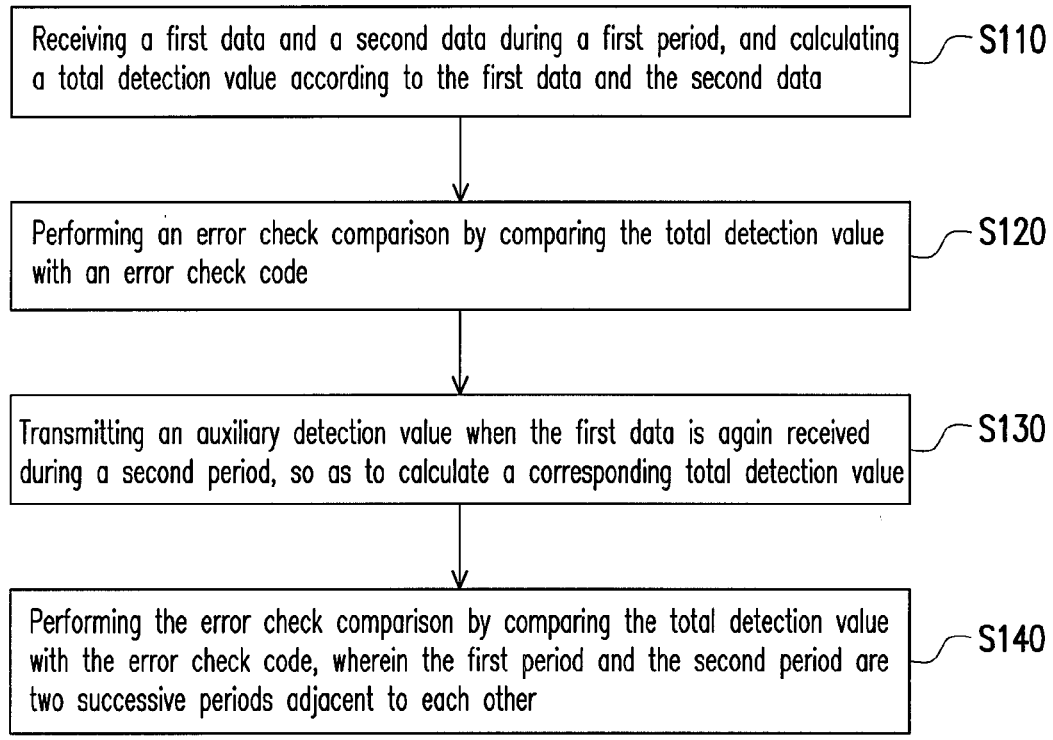
FIG. 3 is a flowchart illustrating a data transmission detecting method according to another embodiment of the invention.

Besides, according to another aspect, another embodiment of the invention provides a data transmission detecting method. FIG. 3 is a flowchart illustrating a data transmission detecting method according to another embodiment of the invention. Referring to FIG. 3, the data transmission detecting method includes following steps. First, a first data and a second data are received during a first period, and a total detection value is calculated according to the first data and the second data (step S110). Then, an error check comparison is performed by comparing the total detection value with an error check code (step S120). Then, when another batch of the first data is received during a second period, an auxiliary detection value is transmitted to calculate a corresponding total detection value (step S130). Finally, the error check comparison is performed by comparing the total detection value with the error check code, wherein the first period and the second period are two successive periods adjacent to each other (step S140). In the present embodiment, the first period and the second period are, for example, the period T1 and the period T2 of FIG. 2B, the first data and the second data are, for example, the data D1 and the data D2 of FIG. 2B, the auxiliary detection value is, for example, the auxiliary detection value crc0 of FIG. 1, and the error check code is, for example the error check codes CRC1 and CRC2 of FIG. 2B.

Since those skilled in the art can learn enough instructions and recommendations of the data transmission detecting method from the descriptions of the embodiment of FIGS. 1-2C, detailed description thereof is not repeated.

In summary, in the invention, the detection value calculating module is used to pre-calculate the auxiliary detection value, and if necessary, the auxiliary detection value can serve as the initial data used for calculating the corresponding detection value of the next stage detecting unit, so that the error of the CRC calculation result generated due to that there is no enough time to initialize the detecting module can be avoided. In this way, it can be determined whether the received data is correct according to the correct total detection value.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data transmission detecting device, comprising:
   a detecting module, comprising a plurality of detecting units cascaded in series, each of the detecting units having a receiving terminal to receive a data outside of the detecting module, and at least two of the detecting units respectively receiving a first data and a second data during a first period at the same time, the detecting module calculating a total detection value according to the first data and the second data, and performing an error check comparison by comparing the total detection value with an error check code, and a part of the detecting units calculates a second detection value according to a first detection value of the detecting unit of a previous stage and a received data; and
   a detection value calculating module, coupled to the detecting module, wherein when the detecting module again receives the first data during a second period, the detection value calculating module transmits an auxiliary detection value to the detecting module, so that the detecting module calculates a corresponding total detection value according to the auxiliary detection value, wherein the first period and the second period are two successive periods adjacent to each other.

2. The data transmission detecting device as claimed in claim 1, wherein the detection value calculating module calculates the auxiliary detection value during the first period according to the first data received during the second period.

3. The data transmission detecting device as claimed in claim 1, wherein when the detecting module again receives the second data during a third period, the detecting module calculates the corresponding total detection value according to the second data of the third period and the auxiliary detection value.

4. The data transmission detecting device as claimed in claim 1, wherein when the detecting module again receives the first data during the second period, and successively receives the error check code, the detecting module takes the auxiliary detection value as the corresponding total detection value.

5. The data transmission detecting device as claimed in claim 1, further comprising an initial module coupled to the detecting module, and outputting an initial data to initialize the detecting module.

6. The data transmission detecting device as claimed in claim 5, wherein the detecting module calculates the total detection value according to the initial data and the first data of the first period.

7. The data transmission detecting device as claimed in claim 5, wherein the detection value calculating module comprises:
   a calculating unit, for receiving the first data corresponding to the second period, and calculating the auxiliary detection value according to the first data of the second period;

a detecting unit, for detecting a data receiving state of the detecting module, and accordingly outputting a detection result; and a switch, coupled to the detecting unit, receiving the auxiliary detection value and the initial data, and determining to output the initial data or the auxiliary detection value according to the detection result.

8. The data transmission detecting device as claimed in claim 1, wherein the detecting module further comprises a switch unit coupled to the detecting units, and receiving one of the second detection values from the detecting units to serve as the total detection value.

9. The data transmission detecting device as claimed in claim 1, wherein the error check comparison is a cyclic redundancy check (CRC).

10. The data transmission detecting device as claimed in claim 1, wherein the first data and the second data comply with a mobile industry processor interface (MIPI) specification.

11. A data transmission detecting method, adapted to a data transmission detecting device comprising a plurality of detecting units cascaded in series, and each of the detecting units having a receiving terminal to receive a data, the method comprising:

receiving a first data and a second data during a first period at the same time, and calculating a total detection value according to the first data and the second data;

performing an error check comparison by comparing the total detection value with an error check code;

transmitting an auxiliary detection value when the first data is again received during a second period, so as to calculate a corresponding total detection value, wherein the first period and the second period are two successive periods adjacent to each other; and calculating a second detection value according to a first detection value of the detecting unit of a previous stage and a received data.

12. The data transmission detecting method as claimed in claim 11, wherein the auxiliary detection value is calculated during the first period according to the first data received during the second period.

13. The data transmission detecting method as claimed in claim 11, further comprising calculating the corresponding total detection value according to the second data of a third period and the auxiliary detection value when the second data is again received during the third period.

14. The data transmission detecting method as claimed in claim 11, further comprising taking the auxiliary detection value as the corresponding total detection value when the first data is again received during the second period, and the error check code is successively received.

15. The data transmission detecting method as claimed in claim 11, further comprising outputting an initial data.

16. The data transmission detecting method as claimed in claim 15, wherein the total detection value is calculated according to the initial data and the first data of the first period.

17. The data transmission detecting method as claimed in claim 15, further comprising:

detecting a data receiving state of a detecting module, so as to output a detection result; and receiving the auxiliary detection value and the initial data, and outputting the initial data or the auxiliary detection value according to the detection result.

18. The data transmission detecting method as claimed in claim 11, wherein the total detection value is the second detection value.

19. The data transmission detecting method as claimed in claim 11, wherein the first data and the second data comply with a mobile industry processor interface (MIPI) specification.

20. An electronic device comprising the data transmission detecting device as claimed in claim 1.

* * * * *